(12) United States Patent
Shimizu et al.

(10) Patent No.: US 8,375,538 B2
(45) Date of Patent: Feb. 19, 2013

(54) METHOD FOR MANUFACTURING PIEZOELECTRIC ACTUATOR

(75) Inventors: Hideki Shimizu, Ohbu (JP); Takao Ohnishi, Niwa-Gun (JP); Takashi Ebigase, Nagoya (JP); Naoki Goto, Ogaki (JP)

(73) Assignee: NGK Insulators, Ltd., Nagoya (JP)

( * ) Notice: Subject to any disclaimer, the term of this patent is extended or adjusted under 35 U.S.C. 154(b) by 274 days.

(21) Appl. No.: 12/729,532

(22) Filed: Mar. 23, 2010

(65) Prior Publication Data

US 2010/0242242 A1    Sep. 30, 2010

(30) Foreign Application Priority Data

Mar. 27, 2009 (JP) .................................. 2009-078283

(51) Int. Cl.
*H04R 17/10* (2006.01)
*H01L 41/22* (2006.01)

(52) U.S. Cl. ........... 29/25.35; 29/846; 29/851; 310/357; 310/365

(58) Field of Classification Search ............... 29/25.35, 29/846, 851, 830; 310/357, 365, 330, 332; 347/71, 72; 369/126, 127, 137, 144
See application file for complete search history.

(56) References Cited

U.S. PATENT DOCUMENTS

| | | | |
|---|---|---|---|
| 5,079,472 A | 1/1992 | Uhl et al. | |
| 6,739,704 B2 * | 5/2004 | Takahashi | 347/72 |
| 7,084,554 B2 * | 8/2006 | Xu et al. | 310/332 |
| 2007/0216260 A1 * | 9/2007 | Yura et al. | 310/357 X |
| 2008/0042521 A1 | 2/2008 | Kawakubo et al. | |
| 2008/0259779 A1 * | 10/2008 | Bedillion et al. | 369/126 |

FOREIGN PATENT DOCUMENTS

| | | | |
|---|---|---|---|
| EP | 1 089 352 A1 | 4/2001 | |
| JP | 59-132182 | 7/1984 | |
| JP | 03142888 A * | 6/1991 | 29/25.35 |
| JP | 2001-320103 A1 | 11/2001 | |
| JP | 2008-005642 A1 | 1/2008 | |

OTHER PUBLICATIONS

"Phenomenological Dielectric," 24th Edition, Institute of Electrical Engineers of Japan, pp. 153-188.

* cited by examiner

*Primary Examiner* — A. Dexter Tugbang
(74) *Attorney, Agent, or Firm* — Burr & Brown

(57) ABSTRACT

There is provided a method for manufacturing a piezoelectric actuator where the planar shape is adjusted by subjecting the piezoelectric body layer located on one of the outer surfaces in the two or more piezoelectric body layers to a polarization treatment to control remnant polarization of the piezoelectric body layer. The piezoelectric actuator is used as a drive portion of a piezoelectric drive type variable capacitor. The variable capacitor has high mechanical strength and excellent reliability for a long period of time. The relation between the displacement amount of the piezoelectric actuator and the capacity of the capacitor is stable, and the variable capacity is wide.

3 Claims, 2 Drawing Sheets

METHOD FOR MANUFACTURING PIEZOELECTRIC ACTUATOR

BACKGROUND OF THE INVENTION

1. Field of the Invention

The present invention relates to a method for manufacturing a piezoelectric actuator capable of adjusting the shape thereof and to a piezoelectric actuator adaptable to the method for manufacturing a piezoelectric actuator and formed unitarily with a support to have excellent mechanical strength.

2. Description of Related Art

Cell phones have been spreading globally. However, they have not yet been standardized. Therefore, each cell phones require a RF (Radio Frequency) circuit in accordance with the standard (frequencies) of each country in the world. Therefore, it is necessary to change specification depending on each country or to mount a plurality of RF circuits in order to respond to all the standards. This causes cost increase, and, particularly in the latter case, it becomes an obstacle to miniaturization.

In order to solve such a problem, in recent years, a variable capacitor has been proposed. For a variable capacitor, there are drive systems such as a piezoelectric drive type, an electrostatic drive type, and an electromagnetic type drive type. Generally, an electrostatic drive type is employed be cause of a simple structure and easy production. However, it needs a high drive voltage and has a narrow variable capacity as the points to be improved. In addition, an electromagnetic drive type has high power consumption.

Therefore, in recent years, development of a piezoelectric drive type variable capacitor has been having high expectations. Incidentally, prior art documents are JP-A-2008-005642, JP-A-2001-320103, and "Phenomenological Dielectric", $24^{th}$ edition, Pages 153 to 188, issued by the Institute of Electrical Engineers of Japan.

However, in a conventional piezoelectric drive type variable capacitor, the interval between two capacitor electrodes is not fixed due to remnant strain in the production process, and the two capacitors may fail to come close or draw apart from each other while maintaining parallelism. In such a case, the relation between the displacement amount of the piezoelectric actuator and capacity of the capacitor becomes unstable, and two capacitor electrodes are brought into contact with each other, thereby decreasing the width of the variable capacity.

FIG. 3 is a schematic view showing a conventional piezoelectric drive type variable capacitor showing a condition where the piezoelectric actuator of the variable capacitor is driving. In the variable capacitor 30 shown in FIG. 3, in a piezoelectric actuator 31 having a bimorph type actuator portion 38 having an end portion fixed to a support 39, a capacitor electrode 36 is disposed on one surface of the actuator portion 38, and another capacitor electrode 33 is disposed so as to face the capacitor electrode 36. In the variable capacitor 30, the actuator portion 38 of the piezoelectric actuator 31 is transformed in the directions of the arrows (in FIG. 3) to control the distance between the capacitor electrodes 33 and 36, and thereby the electrostatic capacity generated between them can be changed. However, as shown in FIG. 3, in a conventional variable capacitor 30, since the actuator portion 38 of the piezoelectric actuator 31 is transformed to have an arcuate shape, the capacitor electrodes 33 and 36 fail to come close or draw apart from each other while maintaining parallelism, and the capacitor electrodes 33 and 36 are brought into contact with each other in some cases.

SUMMARY OF THE INVENTION

The present invention has been made in view of the aforementioned circumstances and aims to solve the aforementioned problem and to be able to provide a piezoelectric drive type variable capacitor having thea stable relation between the displacement amount of the piezoelectric actuator and the capacity of the capacitor and having wide variable capacity. As a result of further investigation, it has been found out that the aforementioned problems can be solved by the following means.

That is, according to the present invention, there is provided a method for manufacturing a piezoelectric actuator having an actuator portion including two or more planar piezoelectric body layers and electrode layers provided between the two or more planar piezoelectric body layers and on at least one of the outer surfaces of the piezoelectric body layers, and a support supporting an end of the actuator portion; wherein the method is characterized in that the planar shape is adjusted by subjecting the piezoelectric body layer located on one of the outer surfaces of the two or more piezoelectric body layers to a polarization treatment to control remnant polarization of the piezoelectric body layer.

In the method for manufacturing a piezoelectric actuator of the present invention, it is preferable that one of the two or more piezoelectric body layers has a different remnant polarization from the other piezoelectric body layer(s).

In the method for manufacturing a piezoelectric actuator of the present invention, it is preferable that both the outer surfaces of the piezoelectric body layers are fired surfaces.

In the method for manufacturing a piezoelectric actuator of the present invention, it is preferable that electrode layers are provided on both the outer surfaces of the piezoelectric body layer.

In method for manufacturing a piezoelectric actuator of the present invention, it is preferable that at least one of the electrode layers provided between two or more piezoelectric body layers is extended to the inside of the support to make the electric layer longer than the piezoelectric body layers.

In the method for manufacturing a piezoelectric actuator of the present invention, it is preferable that the electrode layers are thinner than the piezoelectric body layers. It is undesirable that the electrode layers are thicker than the piezoelectric body layers, or same thickness, because the displacement of the piezoelectric body layers might be obstructed.

A method for manufacturing a piezoelectric actuator of the present invention can adjust the planar shape by controlling the remnant polarization of the piezoelectric body layers. Therefore, when a piezoelectric actuator obtained by a method for manufacturing a piezoelectric actuator of the present invention is used as a drive portion in a piezoelectric drive type variable capacitor, the two capacitor electrodes can realize a planar shape where they come close or draw apart from each other while maintaining parallelism, and therefore it is possible to stabilize the relation between the displacement amount and the capacity of the capacitor in the piezoelectric drive type variable capacitor. As a matter of course, there does not arise the problem of decreased width of the variable capacity due to contact of two capacitor electrodes, and the width of the variable capacity can be made large.

A method for manufacturing a piezoelectric actuator of the present invention can adjust the planar shape by controlling the remnant polarization of the piezoelectric body layer. Therefore, a piezoelectric actuator obtained by a method for manufacturing a piezoelectric actuator of the present invention is suitable as, for example, a piezoelectric actuator disclosed in JP-A-2001-320103, which needs planarity. In other words, a method for manufacturing a piezoelectric actuator of the present invention is suitable as a means for manufacturing, for example, the piezoelectric actuator disclosed in JP-A-2001-320103.

Since, in a method for manufacturing a piezoelectric actuator of the present invention, both the outer surfaces of the piezoelectric body layers are fired surfaces in a preferable embodiment, a piezoelectric actuators obtained by a method for manufacturing a piezoelectric actuator of the present invention can improve adhesion with another member (electrode), and an adhesive may be unnecessary.

In a method for manufacturing a piezoelectric actuator of the present invention, electrode layers are provided on both the outer surfaces of the piezoelectric body layers in a preferable embodiment. The provision of electrodes increases mechanical strength and impart a symmetric shape in a lamination direction. Therefore, the actuator portion easily has a flat shape. Therefore, a piezoelectric actuator obtained by a method for manufacturing a piezoelectric actuator of the present invention is suitable as a drive portion in a piezoelectric drive type variable capacitor.

In a method for manufacturing a piezoelectric actuator of the present invention, since at least one of the electrode layers provided between two or more piezoelectric layers is extended to the inside of the support to make the electrode layer longer than the piezoelectric body layers, a piezoelectric actuator obtained by a method for manufacturing a piezoelectric actuator of the present invention has high mechanical strength and hardly cause a crack between the actuator portion and the support even if transformation is repeated when the actuator is used as a drive portion in a piezoelectric drive type variable capacitor to have an excellent reliability for a long period of time.

Figure 1:
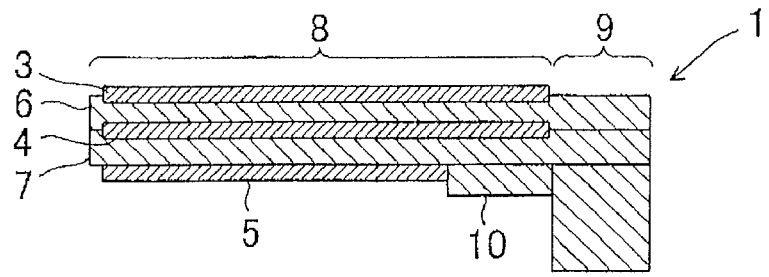
FIG. 1 is a cross-sectional view showing an embodiment of a piezoelectric actuator as an object of a method for manufacturing a piezoelectric actuator of the present invention.

REFERENCE NUMERALS 1, 11, 41, 51: piezoelectric actuator, 8, 18, 48, 58: actuator portion, 9, 19, 49, 59: support, 3, 13, 53: electrode layer, 4, 14, 54: electrode layer, 5, 15, 55: electrode layer, 6, 16, 56: piezoelectric body laver, 7, 17, 57: piezoelectric body layer. 10: protruding portion. 20: corner filling portion. 30: variable capacitor, 31: piezoelectric actuator, 33,43: another capacitor electrode, 36, 46: capacitor electrode, 38: actuator portion, 39: support, 40: variable capacitor, 50: actuator portion precursor, 61: resist

DETAILED DESCRIPTION OF THE INVENTION

Hereinbelow, embodiments of the present invention will be described with appropriately referring to drawings. However, the present invention should not be construed by limiting to these embodiments, and various changes, modifications, and improvements may be made on the basis of knowledge of a person of ordinary skill as long as they do not deviate from the range of the present invention. For example, the drawings show suitable embodiments of the present invention. However, the present invention is by no means limited by the embodiments shown in the drawings and information shown in the drawings. Though the same means as a means described in the present invention or a means equivalent to a means described in the present invention can be applied, a suitable means is the means described below.

Figure 2:
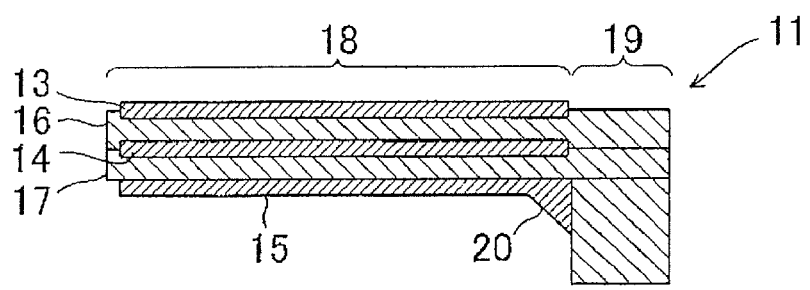
FIG. 2 is a cross-sectional view showing another embodiment of a piezoelectric actuator as an object of a method for manufacturing a piezoelectric actuator of the present invention.
Figure 3:
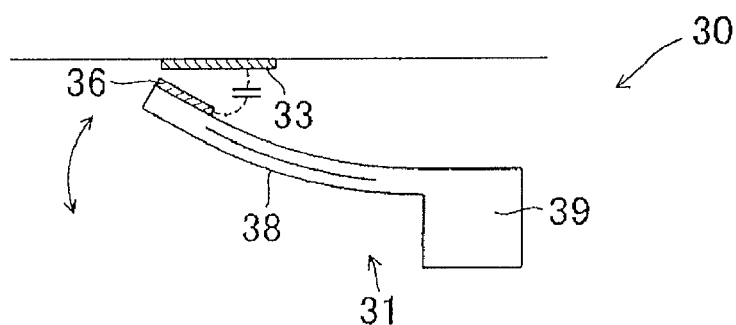
FIG. 3 is a schematic view showing an example of a conventional (piezoelectric drive type) variable capacitor.
Figure 4:
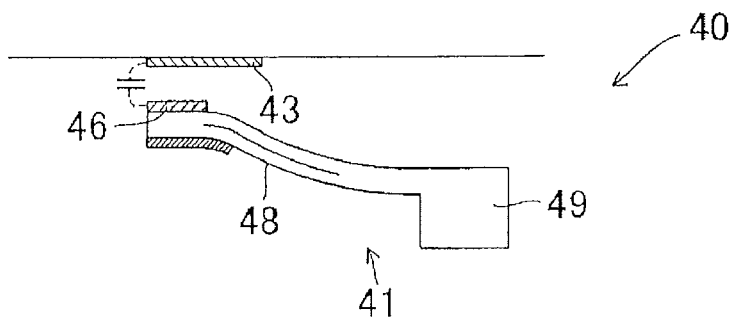
FIG. 4 is a schematic view showing an example of a (piezoelectric drive type) variable capacitor using a piezoelectric actuator as an object of a method for manufacturing a piezoelectric actuator of the present invention.

First, description will be made regarding a piezoelectric actuator as an object of a method for manufacturing a piezoelectric actuator of the present invention. FIG. 1 is a cross-sectional view showing an example of a piezoelectric actuator, and FIG. 2 is a cross-sectional view showing another example. In addition, FIG. 4 is a schematic view showing a piezoelectric drive type variable capacitor using a piezoelectric actuator as the drive portion, showing an effect of a piezoelectric actuator manufactured by a method for manufacturing a piezoelectric actuator of the present invention.

The piezoelectric actuator 1 shown in FIG. 1 has an actuator portion 8 having two piezoelectric body layers 6, 7 and electrode layers 3, 4, 5 provided between the piezoelectric body layers 6 and 7 and on both the outer surfaces of the piezoelectric body layers 6, 7; and a support 9 supporting an end of the actuator portion 8. In the piezoelectric actuator 1, both the piezoelectric body layers 6 and 7 are formed unitarily with the support 9 by firing, the electrode layer 3 is provided on the outer surface of the piezoelectric body layer 6, and the electrode layer 5 is provided on the outer surface of the piezoelectric body layer 7. In other words, in the piezoelectric actuator 1, support 9 is fired integrally with both the piezoelectric body layers 6 and 7.

In the piezoelectric actuator 1, the support 9 protrudes on the outer surface side of the piezoelectric body layer 7. On the side, at the boundary between the support 9 and the piezoelectric body layer 7, a protruding portion 10 (made of a piezoelectric material) as a piezoelectric body is provided, thereby forming a bump. Incidentally, the protruding portion does not have to be provided in accordance with the use.

In addition, in the piezoelectric actuator 1, regarding the piezoelectric body layer 6, the surface where the electrode layer 3 is provided (the outer surface of the piezoelectric body layer 6) is constituted as a fired face, and, regarding the piezoelectric body layer 7, the surface where the electrode layer 5 is provided (the outer surface of the piezoelectric body layer 7) is also constituted as a fired face.

In addition, in the piezoelectric actuator 1, the piezoelectric body layer 6 is not oriented, and the piezoelectric body layer 6 is different in remnant polarization (for example) from the piezoelectric body layer 7. In addition, the electrode layer 4 may be extended to the inside of the support 9 in the piezoelectric actuator 1 though it is not illustrated. The provision of the extended electrode layer 4 improves the strength of the support 9.

The piezoelectric actuator 11 shown in FIG. 2 has, like the actuator 1, an actuator portion 18 having two piezoelectric body layers 16, 17 and electrode layers 13, 14, 15 provided between the electrode body layers 16 and 17 and on the outer surfaces of the piezoelectric body layer 16 and 17; and a support 19 for supporting an end of the actuator portion 18. In the piezoelectric actuator 11, the piezoelectric body layers 16 and 17 are formed unitarily with the support 19 by firing, the electrode layer 13 is provided on the outer surface of the piezoelectric body layer 16, and the electrode layer 15 is provided on the outer surface of the piezoelectric body layer 17. In other words, in the piezoelectric actuator 11, support 19 is fired integrally with both the piezoelectric body layers 16 and 17.

In the piezoelectric actuator 11, the support 19 protrudes on the outer surface side of the piezoelectric body layer 17 where the electrode layer 15 is provided. At the boundary of the support 19 and the piezoelectric body layer 17, a corner-filling portion 20 (made of electrode material) of an electrode is provided, thereby forming a curved face or a flat face in the corner.

In addition, piezoelectric actuator 11, like the piezoelectric actuator 1, regarding the piezoelectric body layer 16, the surface where the electrode layer 13 is provided (the outer surface of the piezoelectric body layer 16) is constituted of a fired face, and, regarding the piezoelectric body layer 17, the surface where the electrode layer 15 is provided (the outer surface of the piezoelectric body layer 17) is also constituted of a fired face.

In addition, in the piezoelectric actuator 11, the piezoelectric body layer 16 is not oriented, and the piezoelectric body layer 16 is different in density (for example) from the piezoelectric body layer 17. In addition, the electrode layer 14 may be extended to the inside of the support 19 in the piezoelectric actuator 11 though it is not illustrated.

As the aforementioned piezoelectric actuators 1 and 11, in a piezoelectric actuator, the support protrudes on one of the outer surfaces of the piezoelectric body layers, and, on the side, at the boundary between the support and the piezoelectric body layer, a bump of piezoelectric body is provided, or the support protrudes on the outer surface on the side where an electrode layer is provided in the outer surfaces of the piezoelectric body layers, and a corner-filling portion by an electrode is provided at the boundary of the support and the piezoelectric body layer to obtain a piezoelectric actuator having high mechanical strength and excellent reliability for a long period of time because it hardly has a crack between the actuator portion and the support even if transformation is repeated when it is used as a drive portion of a piezoelectric drive type variable capacitor.

In the variable capacitor 40 shown in FIG. 4, in a piezoelectric actuator 41 having an actuator portion 48 fixed at an end thereof to the support 49, a capacitor electrode 46 is disposed on one of the surfaces of the actuator portion 48, and the other capacitor electrode 43 is disposed so as to face the capacitor electrode 46. In the variable capacitor 40, the distance between the capacitor electrode 43 and 46 is controlled by transforming the actuator portion 48 of the piezoelectric actuator 41 in the arrow directions (in FIG. 4), and thereby the electrostatic capacity generated between the electrodes can be changed. In addition, since a piezoelectric actuator 41 capable of adjusting a planar shape of the actuator portion 48 is employed in the variable capacitor 40, the capacitor electrodes 43 and 46 can come close or draw apart from each other while maintaining parallelism.

Figure 5:
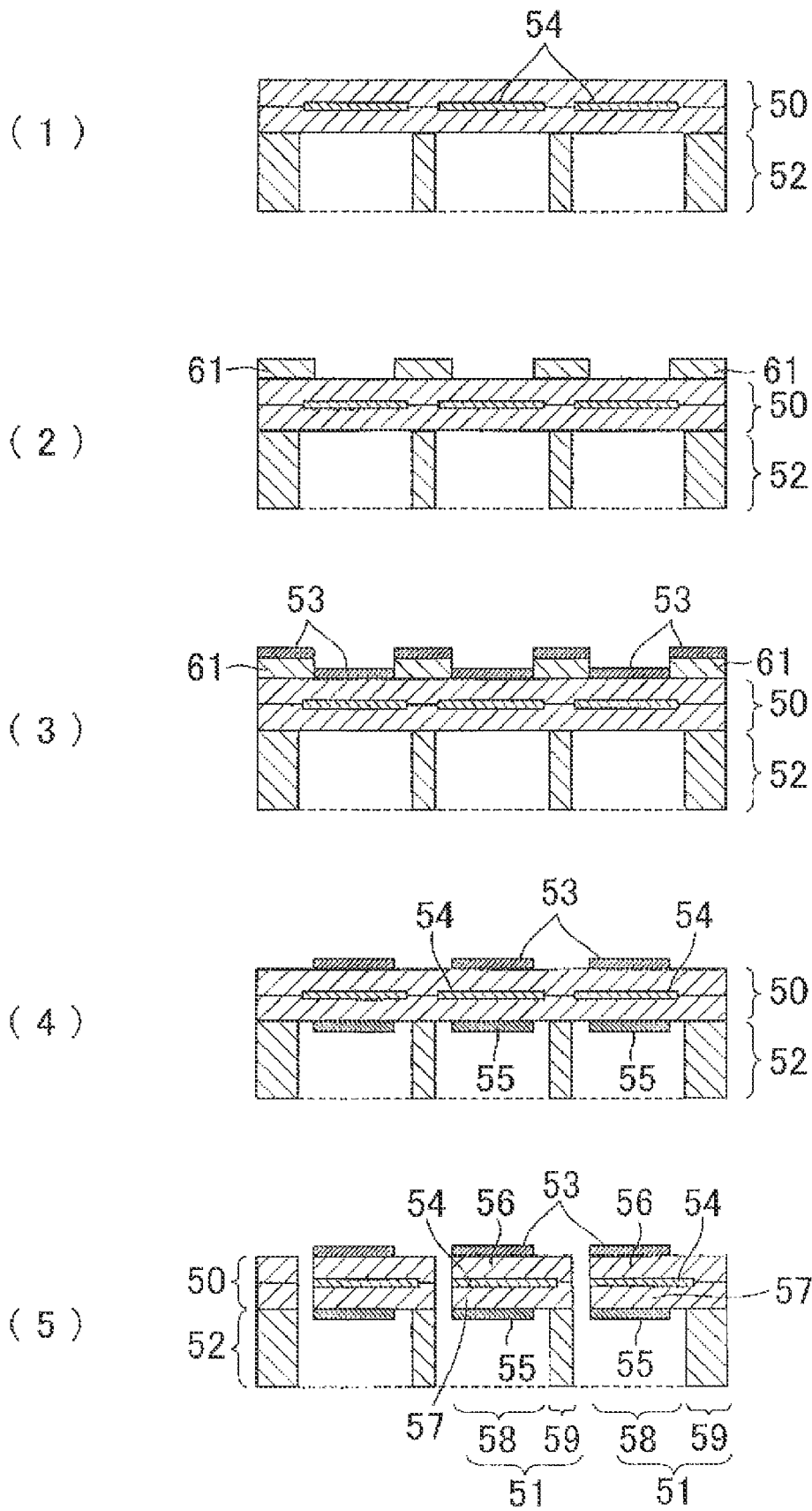
FIG. 5 is a view showing steps (1) to (5) by cross-sectional views showing an embodiment in a method for manufacturing a piezoelectric actuator of the present invention.

Next, a method for manufacturing a piezoelectric actuator of the present invention will be described. FIG. 5 shows steps (1) to (5) by cross-sectional views showing an embodiment in a method for manufacturing a piezoelectric actuator of the present invention. The method for manufacturing a piezoelectric actuator shown in the steps (1) to (5) is a method where a plurality of piezoelectric actuators are manufactured at the same time (multi-manufacture). Incidentally, FIG. 5 is a schematic view for easy understanding of the production process, and therefore the thickness of the piezoelectric body layers and the thickness of the electrode layers are not in the preferable states.

In a method for manufacturing a piezoelectric actuator of the present invention, in the first place, an actuator portion precursor 50 is manufactured by the use of a piezoelectric material and an electrode material. The actuator portion precursor 50 later becomes mainly actuator portions. However, a part becomes supports. The actuator portion precursor 50 can be obtained specifically by preparing slurry by adding a binder, a solvent, a dispersant, a plasticizer, and the like to a ceramic powder such as lead zirconate, followed by mixing to obtain a mixture; subjecting the mixture to defoaming; manufacturing two green sheets of, for example, the same piezoelectric material by a method such as a reverse roll coater method or a doctor blade method; forming an electrode layer 54 (which will be held between the piezoelectric body layers) on one of the green sheets by the use of a conductive material (e.g., gold and electrode material); and the two green sheets are laminated with the electrode layer 54 being located between the green sheets.

In addition, a support precursor 52 is manufactured separately. This is practically a green sheet. For example, slurry is manufactured by adding a binder, a solvent, a dispersant, a plasticizer, and the like to the same ceramic power such as lead zirconate, followed by mixing to obtain a mixture; subjecting the mixture to defoaming; manufacturing a green sheet by a method such as a reverse roll coater method or a doctor blade method; subjecting the sheet to punching using a die, laser processing, or the like to make the outer shape equivalent to or larger than the shape of the actuator portion precursor 50 and to make the portions facing the portions which later become actuator portions open.

After the actuator portion precursor 50 and the support precursor 52 are bonded together, firing is performed at appropriate temperature within the range from 800 to 1600° C. on the basis of the piezoelectric material to be used (This is the step 1. See FIG. 5)

Next, in order to form an electrode layer 53 located on one of the outer peripheral surface, resist patterning is performed (step (2)). That is, for example, by a light exposure method, the resists 61 are applied on the surface of the actuator portion precursor 50 on the side without the support precursor 52 except for the portions which become electrode layers 53 later.

Next, a membrane-shaped electrode layer 53 of a conductive material (e.g., gold) is formed by, for example, sputtering (step (3)).

Next, the resists 61 are removed by, for example, a release agent to leave only a membrane-shaped electrode layer 53. Also, on the side having support precursor 52 of the actuator portion precursor 50, resist patterning, forming of a membrane-shaped electrode layer 55, and removal of the resists are performed in the same manner to leave only a membrane-shaped electrode layer 55 (step (4)).

Then, the actuator portion precursor 50 was cut to obtain several piezoelectric actuators 51 (step (5)). The piezoelectric actuator 51 has an actuator portion 58 and a support 59 supporting an end of the actuator portion 58. The actuator portion 58 has two piezoelectric body layers 56, 57, and electrode layers 53, 54, 55 provided between the piezoelectric body layers 56 and 57 and on both the outer surfaces of the piezoelectric body layers 56, 57.

Finally, in each of the piezoelectric actuators 51, first, a voltage is applied only on the piezoelectric layer 56, and a predetermined polarization treatment is performed for generating strain. Then, a polarization treatment is applied only to the piezoelectric body layer 57, and remnant polarization of the piezoelectric body layer 57 is controlled to adjust a planar shape of the piezoelectric actuator 51 (actuator portion 58). In such a manner as described above, a piezoelectric actuator of the present invention, having an adjusted planar shape and high mechanical strength, can be obtained. When the piezoelectric body layer 57 is subjected to a polarization treatment, it is preferable that the remnant polarization is determined with measuring a warpage amount by a displacement gauge or the like because the planar shape can be changed into a predetermined shape easily in comparison with the case without the measurement.

Next, the material used for the piezoelectric actuator will be described. In the first place, the material for the piezoelectric body layer (piezoelectric material) will be described. There is no particular limitation on the material as long as it causes electric-field-induced strain (electrostriction) of a piezoelectric effect, an electrostrictive effect, or the like. It is possible to use a semi-conductor ceramic, a ferroelectric ceramic, or an antiferroelectric ceramic, and the material may be selected appropriately in accordance with the usage. In addition, the material may be a material which needs a polarization treatment or a material which does not need a polarization treatment.

Preferable examples of the material include lead zirconate, lead titanate, lead magnesium niobate, lead nickel niobate, lead nickel tantalate, lead zinc niobate, lead manganese niobate, lead antimony stannate, lead manganese tungstate, lead cobalt niobate, lead magnesium tungstate, lead magnesium tantalate, barium titanate, sodium titanate, bismuth sodium titanate, bismuth neodymium titanate, potassium sodium niobate, strontium bismuth tantalate, copper tungsten barium, bismuth ferrate, and a compound oxide containing two or more among these components. In addition, it is possible that an oxide of lanthanum, calcium, strontium, molybdenum, tungsten, barium, niobium, zinc, nickel, manganese, cerium, cadmium, chrome, cobalt, antimony, iron, yttrium, tantalum, lithium, bismuth, stannum, or copper may be solid-solved in the above materials.

Further, a material obtained by adding lithium bismuthate, lead germanate, or the like to the above material, for example, a material obtained by adding lithium bismuthate or lead germanate to a compound oxide of lead zirconate, lead titanate, and lead magnesium niobate is preferable because it can exhibit high material properties with realizing low temperature firing of the piezoelectric body.

It is preferable that the material for above-mentioned the piezoelectric body layer have Non-180° Domain structure after firing, and it is especially preferable that the material have 90° Domain structure after firing. The piezoelectric body layer formed with the material can get the wide span of adjustable range to adjust a planar shape, because the remnant strain is controlled easily by the remnant polarization of the piezoelectric body layer.

Incidentally, as the material for the support, the aforementioned piezoelectric material can be employed. It is preferable to use the same material as the material for the piezoelectric actuator (green sheet) in order to make the thermal expansion equivalent.

Next, as the material for the electrode layer (electrode material), a conductive material, particularly, a metal is employed. It is preferable to use, for example, a simple metal such as aluminum, titanium, chrome, iron, cobalt, nickel, copper, zinc, niobium, molybdenum, ruthenium, palladium, rhodium, silver, stannum, tantalum, tungsten, iridium, platinum, gold, or lead; or an alloy of two or more kinds selected from the above metals, for example, using a silver-platinum, platinum-palladium, silver-palladium, and the like alone or in combination of two or more kinds. In addition, the material may be a mixture or a cermet of these materials and aluminum oxide, zirconium oxide, titanium oxide, silicon oxide, cerium oxide, glass, a piezoelectric material, or the like. These materials are preferably selected in accordance with the kind of the piezoelectric material.

A method for manufacturing a piezoelectric actuator of the present invention can suitably be used as, for example, a means for manufacturing a piezoelectric actuator used as an actuator portion of a variable capacitor.

What is claimed is:

1. A method for manufacturing a piezoelectric actuator, the method comprising the steps of:
    providing a piezoelectric actuator having an actuator portion including two or more planar piezoelectric body layers and electrode layers, one electrode layer being provided between the two or more planar piezoelectric body layers and on at least one outer surface of one of the two or more piezoelectric body layers, and a support supporting an end of the actuator portion;
    subjecting at least one but not all, of the two or more piezoelectric body layers to a predetermined polarization treatment; and
    adjusting a planar shape of the actuator portion by subjecting at least one of the other piezoelectric body layers to a polarization treatment to control remnant polarization of the at least one of the other piezoelectric body layers.

2. A method for manufacturing a piezoelectric actuator according to claim 1, wherein one of the two or more piezoelectric body layers has a different remnant polarization from the other piezoelectric body layers.

3. A method for manufacturing a piezoelectric actuator according to claim 1, wherein both outer surfaces of the piezoelectric body layers are fired surfaces.

* * * * *